(12) United States Patent
Kasuga (10) Patent No.: US 7,285,808 B2
(45) Date of Patent: Oct. 23, 2007

(54) SOLID-STATE IMAGING DEVICE AND METHOD FOR MANUFACTURING SOLID-STATE IMAGING DEVICE

(75) Inventor: Takashi Kasuga, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/491,520

(22) PCT Filed: Oct. 2, 2002

(86) PCT No.: PCT/JP02/10266

§ 371 (c)(1),
(2), (4) Date: Apr. 1, 2004

(87) PCT Pub. No.: WO03/032395

PCT Pub. Date: Apr. 17, 2003

(65) Prior Publication Data

US 2005/0077588 A1    Apr. 14, 2005

(30) Foreign Application Priority Data

Oct. 3, 2001    (JP)    ............................. 2001-307349

(51) Int. Cl.
 H01L 27/148    (2006.01)
 H01L 29/74    (2006.01)
 H01L 29/768    (2006.01)
(52) U.S. Cl. ................... 257/223; 257/224; 257/229; 257/230; 257/E27.163; 257/E21.617

(58) Field of Classification Search ................ 257/223, 257/224, 229, 230
See application file for complete search history.

(56) References Cited

U.S. PATENT DOCUMENTS 5,179,428 A    1/1993    Lee

FOREIGN PATENT DOCUMENTS

JP    02-278768 A    11/1990
JP    05-190828 A    7/1993

*Primary Examiner*—Ngan V. Ngo
(74) *Attorney, Agent, or Firm*—Robert J. Depke; Rockey, Depke & Lyons, LLC.

(57) ABSTRACT

A plurality of optical sensors (4) are arranged in a surface region of a semiconductor substrate (6) in a matrix pattern, and electric charge generated by the optical sensors (4) is transferred by first and second transfer electrodes (12 and 14) embedded under the optical sensors (4). The semiconductor substrate (6) is constructed by laminating a support substrate (16) composed of silicon, a buffer layer (18), and a thin silicon layer (20) composed of single-crystal silicon. p− regions (26) (overflow barrier) and n-type regions (28) which function as transfer paths are formed under the optical sensors (4). The first and the second transfer electrodes (12 and 14) are disposed between the buffer layer (18) and the n-type regions (28), and an insulating film (30) is interposed between the n-type regions (28) and the first and the second transfer electrodes (12 and 14). In this structure, the light-receiving area is large since the transfer electrodes are not disposed in the front region. Accordingly, the sensitivity can be ensured even when the size of the optical sensors (4) is reduced for increasing the number of pixels.

12 Claims, 5 Drawing Sheets

SOLID-STATE IMAGING DEVICE AND METHOD FOR MANUFACTURING SOLID-STATE IMAGING DEVICE

This application claims priority to Japanese Patent Application Number JP2001-307349, filed Oct. 3, 2001 which is incorporated herein by reference.

TECHNICAL FIELD

The present invention relates to a solid-state imaging device.

BACKGROUND ART

Generally, solid-state imaging devices used in commercial digital still cameras, which have recently become increasingly popular in the market, must have a million or more pixels in order to achieve an image quality no less than that of a film camera, and those having three million or more pixels have recently been put to practical use. Additionally, the commercial digital still cameras are required to be reduced in size. Therefore, the number of pixels in the solid-state imaging devices must be increased without changing the chip size thereof, or the increase in the number of pixels and reduction in the chip size must be achieved at the same time.

Interline-transfer interlace-scan (IT-IS) CCDs are typically used as solid-state imaging devices with a large number of pixels. In this type of solid-state imaging device, when the number of pixels is increased without changing the chip size, the size of unit cells used for photoelectric conversion reduces accordingly. Therefore, the sensitivity and the amount of charge which can be carried, that is, a saturation signal level, are reduced. In order to compensate for this, various characteristic improvements have been made so that the number of pixels can be increased without causing the characteristic degradation due to the reduction in the size of the unit cells. However, if the number of pixels is further increased, the performance is inevitably degraded to some extent.

In order to fundamentally solve the above-described problem, solid-state imaging devices in which active devices, such as optical sensors and charge transfer electrodes, are arranged in multiple layers have been proposed, as described below.

(1) A method for increasing the sensitivity of a solid-state imaging device has been proposed in which a photoelectric conversion unit composed of polycrystal silicon or amorphous silicon is formed on a signal charge transfer unit so that the entire surface of the solid-state imaging device functions as a light-receiving surface and the amount of light received increases. However, since the mobility of electrons and holes in polycrystal silicon and amorphous silicon is lower than that in single-crystal silicon, a problem of after-image or the like occurs. Accordingly, it is difficult to put this type of solid-state imaging device to practical use.

(2) A method has been proposed in which the thickness of a silicon substrate is reduced to about several tens of micrometers by back etching and an image is captured by causing light to enter optical sensors from the back. In this method, the amount of incident light increases since it is not impeded by transfer electrodes, and the sensitivity increases accordingly. However, since there is a limit to reducing the thickness of the silicon substrate, the application is limited to cases where infrared light, for which silicon has high transmittance, is received. In addition, it is difficult to increase the precision, and therefore this structure is not suitable for imaging devices with a large number of pixels which are required to be arranged at high density.

(3) A frame transfer (FT) CCD in which a single unit functions as both a photoelectric conversion unit and a charge transfer unit is also advantageous in that it has a large effective-charge-storage area. However, there is a problem in that the sensitivity reduces in a short wavelength region due to light absorption by transfer electrodes. In addition, the amount of dark current generated is large compared to an IT-CCD since a single unit functions as both the photoelectric conversion unit and the charge transfer unit, and there is a problem in that the S/N ratio is low.

In order to solve the above-described problems, a main object of the present invention is to provide a solid-state imaging device having a structure such that the number of pixels can be increased without increasing the size, and to provide a method for manufacturing the solid-state imaging device.

DISCLOSURE OF INVENTION

In a solid-state imaging device according to the present invention and a solid-state imaging device manufactured by a method according to the present invention, electrodes are disposed between a buffer layer and optical sensors, that is, behind the optical sensors. Accordingly, when, for example, the electrodes are used as charge transfer electrodes, it is not necessary to arrange the charge transfer electrodes on the light-receiving surfaces of the optical sensors. In such a case, the light-receiving area of the optical sensors can be increased compared to the known structure.

In addition, when the electrodes are used as overflow drain electrodes, unnecessary charge stored in the optical sensors can be removed by applying a voltage to the electrodes.

In addition, in the method for manufacturing the solid-state imaging device according to the present invention, an overflow barrier is formed by implanting ions into a silicon substrate through a first surface of the silicon substrate at low energy before the electrodes are formed on the first surface of the silicon substrate, the overflow barrier being positioned under the optical sensors when the solid-state imaging device is completed. Accordingly, unlike the known structure, it is not necessary to implant the ions deep into the silicon substrate to form the overflow barrier. Therefore, the profile of the implanted impurities can be reliably controlled and the thickness of the overflow barrier can be reduced.

BEST MODE FOR CARRYING OUT THE INVENTION

Next, embodiments of the present invention will be described below with reference to the accompanying drawings.

Figure 1:
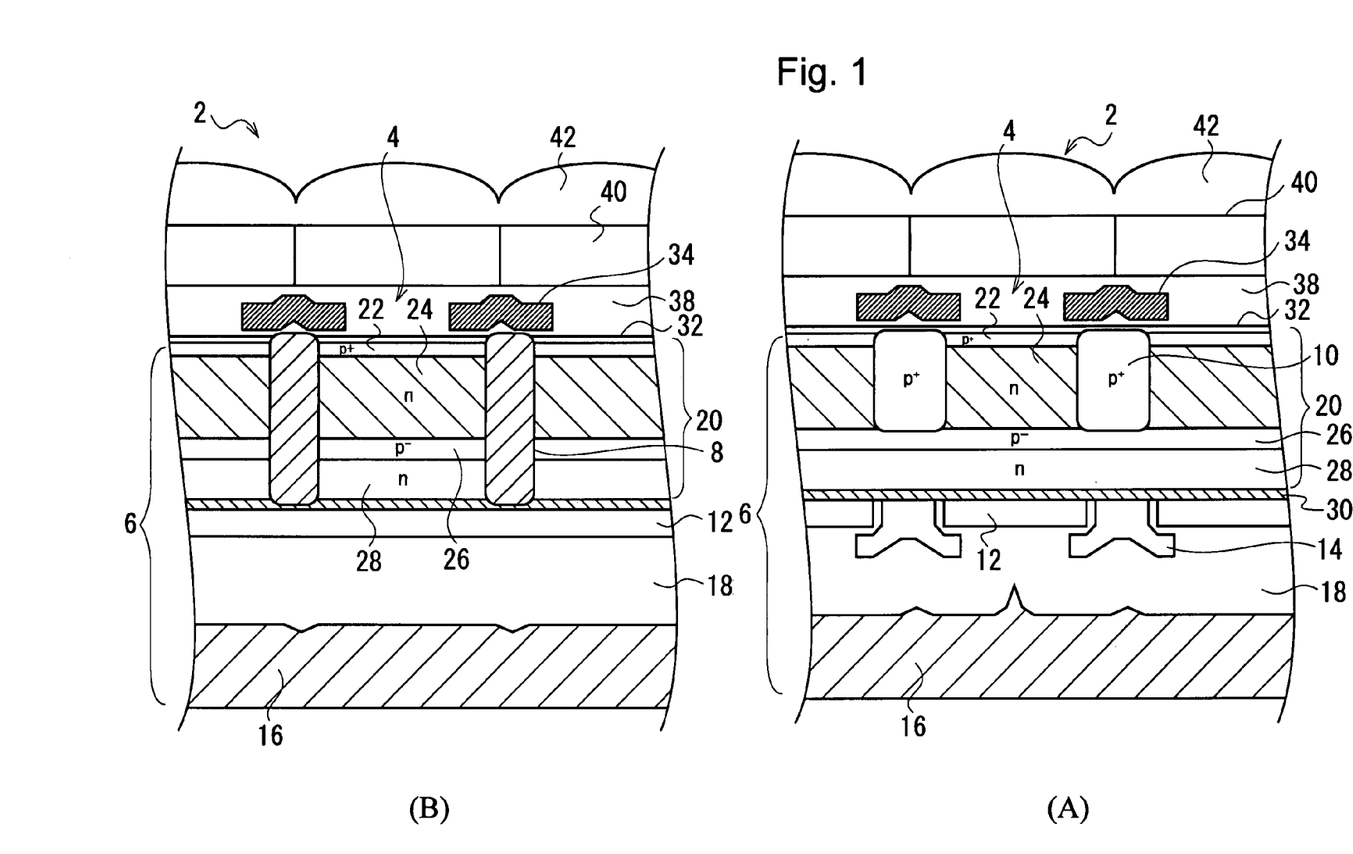
In FIG. 1, (A) and (B) are sectional side views of a part of a solid-state imaging device according to an embodiment of the present invention.
Figure 2:
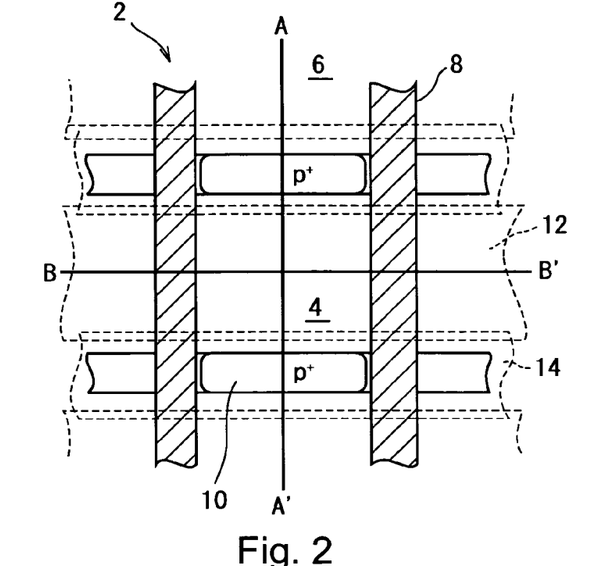
FIG. 2 is a plan view showing a part of the solid-state imaging device shown in FIG. 1.

In FIG. 1, (A) and (B) are sectional side views of a part of a solid-state imaging device according to an embodiment of the present invention, and FIG. 2 is a plan view showing a part of the solid-state imaging device shown in FIG. 1. FIG. 1(A) is a sectional view of FIG. 2 cut along line A-A', and FIG. 1(B) is a sectional view of FIG. 2 cut along line B-B'.

As shown in FIG. 2, a solid-state imaging device 2 according to the present embodiment includes a plurality of optical sensors 4 arranged in a surface region of a semiconductor substrate 6 in a matrix pattern such that the optical sensors 4 are adjacent to one another. The optical sensors 4 on each row are separated from one another by device-separating regions 8, as shown also in FIG. 1(B), and the optical sensors 4 on each column are separated from one another by channel-stop regions 10, as shown also in FIG. 1(A). The channel-stop regions 10 are p-type regions formed by implanting p-type impurity ions at high concentration. FIG. 2 shows the structure under a light-shielding film, which will be described below.

Each optical sensor 4 is provided with first and second transfer electrodes 12 and 14 (electrodes according to the present invention) for transferring signal charge generated by the optical sensor 4 when it receives light. The first and the second transfer electrodes 12 and 14 are provided in common for the optical sensors 4 on each row, and extend along the rows of the optical sensors 4. In addition, the first and the second transfer electrodes 12 and 14 are arranged alternately along the columns of the optical sensors 4. As shown in FIG. 1, according to the present embodiment, the first and the second transfer electrodes 12 and 14 are not provided on the surface of the semiconductor substrate 6 but are embedded under (behind) the optical sensors 4.

The semiconductor substrate 6 is constructed by laminating a support substrate 16 composed of silicon, a buffer layer 18 composed of an insulating material, and a thin silicon layer 20 (single-crystal silicon thin film), in that order from the bottom. The thin silicon layer 20 has the optical sensors 4 in a surface region thereof, and the optical sensors 4 are composed of, for example, p+ regions 22 in which p-type impurities are implanted at high concentration and n-type regions 24 in which n-type impurities are implanted. In addition, p− regions 26 in which p-type impurities are implanted at low concentration are provided under the optical sensors 4 as an overflow barrier, and n-type regions 28 in which n-type impurities are implanted, for example, are provided under the p− regions 26 as transfer paths for transferring the signal charge generated by the optical sensors 4.

The first and the second transfer electrodes 12 and 14 are embedded between the buffer layer 18 and the n-type regions 28, and an insulating film 30 is interposed between the n-type regions 28 and the first and the second transfer electrodes 12 and 14. The first and the second transfer electrodes 12 and 14 may be composed of, for example, polysilicon or a metal such as aluminum and tungsten, and the insulating film 30 may be composed of, for example, silicon oxide, silicon nitride, titanium oxynitride, silicon carbide, etc. As shown in FIG. 1(A), the first and the second transfer electrodes 12 and 14 are separated from each other by an insulating layer. In the present embodiment, the first transfer electrodes 12 are positioned directly under the optical sensors 4, and the second transfer electrodes 14 are positioned under the channel-stop regions 10.

An antireflection film 32 is formed on the surfaces of the optical sensors 4 to prevent the reflection of light entering the optical sensors 4, so that the amount of light entering the optical sensors 4 increases. The antireflection film 32 may be composed of silicon oxide or silicon nitride. A light-shielding film 34 having apertures at positions corresponding to the optical sensors 4 is formed on the thin silicon layer 20 with an insulating layer provided therebetween. In addition, a planarizing film 38 is formed on the light-shielding film 34, and a color filter 40 and an on-chip lens 42 are formed similarly to those in the known solid-state imaging device.

Next, the operation of the solid-state imaging device 2 constructed as above will be described below.

When an image is captured, a mechanical shutter (not shown) placed in front of the solid-state imaging device 2 is released so that light enters each of the optical sensors 4. Each optical sensor 4 performs photoelectric conversion of the light to generate signal charge, and accumulates the generated signal charge. Then, when the mechanical shutter is closed and the exposure is finished, transfer pulses are successively applied to the first and the second transfer electrodes 12 and 14, and unnecessary charge stored in the transfer paths during the exposure is removed.

Next, a positive voltage is applied to alternate first transfer electrodes 12, for example, to $N^{th}$ first transfer electrodes 12 where N is an even number, so that the signal charge accumulated in the corresponding optical sensors 4 is read out and supplied to the n-type regions 28, which function as the transfer paths. In this embodiment, the signal charge is read out by the interlace method, and therefore a positive voltage is applied to the alternate first transfer electrodes 12 as above.

Then, transfer pulses are applied to the first and the second transfer electrodes 12 and 14, so that the signal charge read out as above is successively transferred toward horizontal charge transfer registers (not shown) along the direction in which the first and the second transfer electrodes 12 and 14 are arranged. Thus, the signal charge generated by the optical sensors 4 on each row is supplied to the corresponding horizontal charge transfer register. Then, the signal charge is transferred by the horizontal charge transfer registers, converted into a voltage, and output from the solid-state imaging device 2 as an image signal.

Then, a positive voltage is applied to $M^{th}$ first transfer electrodes 12 where M is an odd number so that the signal charge is read out from the corresponding optical sensors 4. Then, similar to the above, transfer pulses are applied to the first and the second transfer electrodes 12 and 14 so that the signal charge is successively transferred. Accordingly, the signal charge generated by all of the optical sensors is read out from the optical sensors 4, and an image signal representing the captured image is output from the solid-state imaging device 2.

In the solid-state imaging device 2 according to the present embodiment, the transfer electrodes are not formed on the surface of the thin silicon layer 20 as in the known structure, and therefore the area of the optical sensors 4 is increased compared to the known structure. Accordingly, a sufficient amount of light enters the optical sensors 4. Therefore, even when the size of each unit cell (pixel) is reduced to increase the number of pixels without increasing the size of the solid-state imaging device 2, required sensitivity can be achieved and the number of pixels in the solid-state imaging device 2 can be further increased.

In addition, in the case in which the size of each unit cell is the same as that in the known structure, the sensitivity of the solid-state imaging device 2 is higher than that of the known structure since the size of the optical sensors 4 is large. In addition, the amount of charge which can be carried by the optical sensors 4 increases, and the dynamic range of the solid-state imaging device 2 also increases accordingly.

Furthermore, since the thin silicon layer 20 is composed of single-crystal silicon, the mobility of electrons and holes is sufficient, unlike that in polycrystal silicon and amorphous silicon. Therefore, the problem of afterimage or the like does not occur.

In addition, according to the present embodiment, light which enters and passes through the optical sensors 4 is reflected by the surfaces of the first and the second transfer electrodes 12 and 14 or the surface of the insulating film 30, returns to the optical sensors 4, and is converted into electric charge by the optical sensors 4. Even if the returning light passes through the optical sensors 4 again, it is reflected by the top surface or the bottom surface of the antireflection film 32, and is converted into electric charge by the optical sensors 4. Thus, according to the present embodiment, multiple reflection of light occurs between the antireflection film 32 and one of the first and the second transfer electrodes 12 and 14 and the insulating film 30. Therefore, the total distance which light travels in the optical sensors 4 increases, and the photoelectric conversion of incident light is extremely efficient. As a result, sufficient sensitivity can be obtained even when the size, especially the thickness, of the optical sensors 4 is reduced, and thus the size of the solid-state imaging device 2 can be reduced.

Furthermore, when the material and the thickness of the insulating film 30 are suitably selected such that light reflected by the surface of the insulating film 30 and light reflected by the surfaces of the transfer electrodes interfere with each other so as to intensify each other, the intensity of the reflected light further increases and the sensitivity can be increased accordingly. Similarly, when the material and the thickness of the antireflection film 32' are suitably selected such that light reflected by the top surface of the antireflection film 32 and light reflected by the bottom surface of the antireflection film 32 interfere with each other so as to intensify each other, the sensitivity can be further increased.

In addition, since the absorption coefficient of silicon for visible light reduces as the wavelength increases (toward the red region), the depth of the optical sensors 4 is in the range of several micrometers to about 10 micrometers in order to maintain the sensitivity at the red and near-infrared regions in the known structure. However, according to the present embodiment, the depth of the optical sensors 4 is not limited. In addition, when the optical design is adequately performed under the consideration of the refractive index and the thickness of the insulating film 30 and the antireflection film 32 and the wavelength of light, a solid-state imaging device having high sensitivity for any wavelength can be obtained.

In the present embodiment, the signal charge is read out by the interlace method. However, the structure in which each of the optical sensors 4 is provided with three transfer electrodes and the signal charge is simultaneously read out from all of the optical sensors 4 can also be easily obtained.

Next, a second embodiment of the present invention will be described below.

Figure 3:
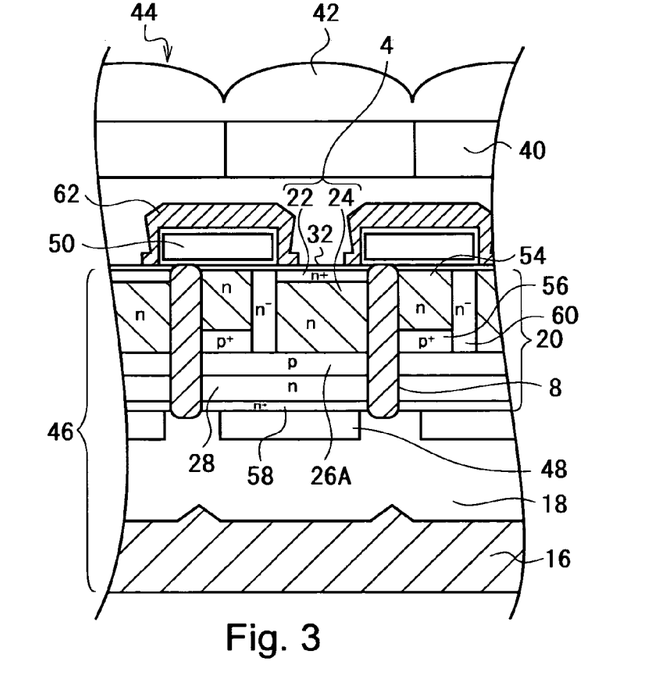
FIG. 3 is a sectional side view of a part of a solid-state imaging device according to a second embodiment of the present invention.
Figure 4:
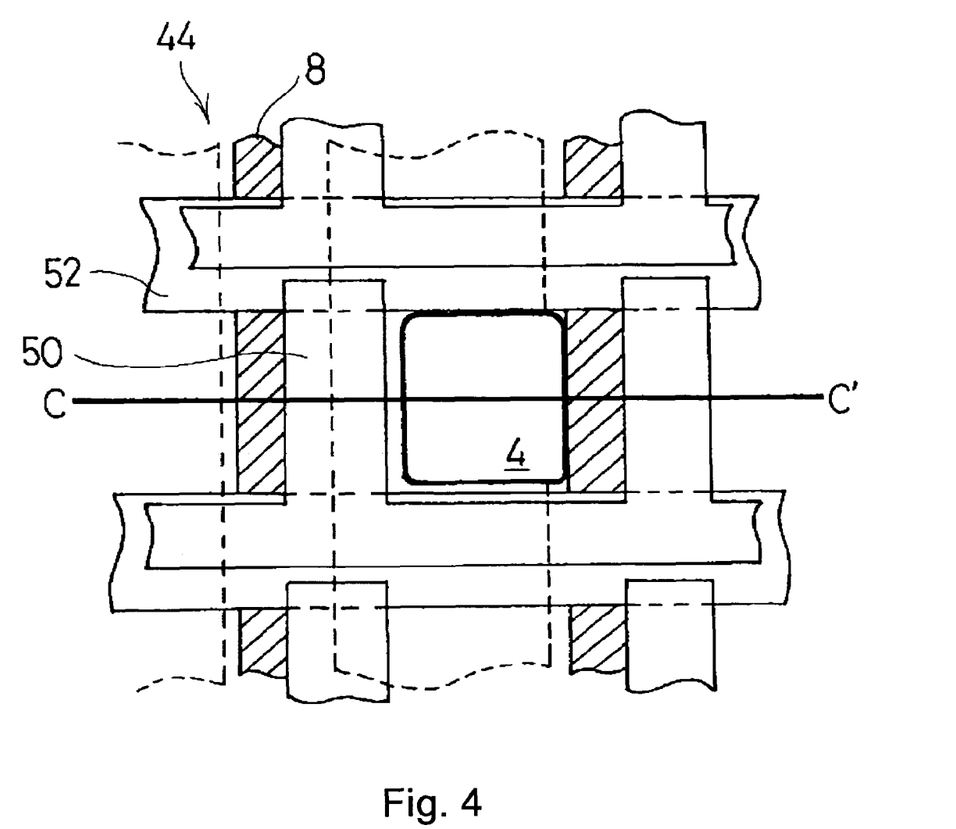
FIG. 4 is a plan view showing a part of the solid-state imaging device according to the second embodiment.

FIG. 3 is a sectional side view of a part of a solid-state imaging device according to the second embodiment of the present invention, and FIG. 4 is a plan view showing a part of the solid-state imaging device according to the second embodiment. FIG. 3 is a sectional view of FIG. 4 cut along line C-C'. In the figures, components similar to those shown in FIG. 1 are denoted by the same reference numerals, and explanations thereof are thus omitted.

With reference to the figures, a solid-state imaging device 44 according to the second embodiment is similar to the known IT-IS solid-state imaging device with respect to optical sensors 4 and the structure for transferring the signal charge. However, it is different from the known solid-state imaging device or the solid-state imaging device 2 according to the above embodiment in that electrodes according to the present invention function as overflow drain electrodes.

The solid-state imaging device 44 has a semiconductor substrate 46 which is constructed by laminating a support substrate 16, a buffer layer 18, and a thin silicon layer 20, and overflow drain electrodes 48 (electrodes according to the present invention) are embedded between the buffer layer 18 and the optical sensors 4, that is, between the buffer layer 18 and the thin silicon layer 20. As shown in FIG. 4, one overflow drain electrode 48 is provided for each column of the optical sensors 4 such that it extends along the columns of the optical sensors 4.

In addition, n+ regions 58 are formed in a surface region of the thin silicon layer 20 which is in contact with the overflow drain electrodes 48.

Each of the optical sensors 4 is provided with first and second surface transfer electrodes 50 and 52, the first and the second surface transfer electrodes 50 and 52 being formed on the thin silicon layer 20 on the side opposite to the buffer layer 18. As shown in FIG. 4, the first and the second surface transfer electrodes 50 and 52 are alternately arranged along the columns of the optical sensors 4. In addition, the first and the second surface transfer electrodes 50 and 52 are provided in common for the optical sensors 4 on each row, and therefore, they extend along the rows of the optical sensors 4. As shown in FIG. 3, n-type regions 54 are formed in the thin silicon layer 20 at positions under the first and the second surface transfer electrodes 50 and 52 as charge transfer paths. In addition, p+ regions 56 are formed between an overflow barrier 26A and n-type regions 54, and n– regions 60 are formed between the charge transfer paths and the optical sensors 4. As shown in FIG. 3, the first and the second surface transfer electrodes 50 and 52 are covered with a light-shielding film 62.

In the solid-state imaging device 44 constructed as above, unnecessary charge accumulated in the optical sensors 4 can be removed by applying a positive voltage to the overflow drain electrodes 48.

Although one overflow drain electrode 48 is provided for each column of the optical sensors 4, the structure may also be, of course, such that one overflow drain electrode 48 is provided for each row of the optical sensors 4 or for each of the optical sensors 4.

Pixel reduction, electronic zooming, highly-functional electronic shutter, etc., can be achieved using the overflow drain electrodes 48.

More specifically, in the solid-state imaging device 44, when a positive voltage is applied to the overflow drain electrodes 48 on alternate columns and the signal charge accumulated in the corresponding optical sensors 4 is removed, alternate columns of pixels can be eliminated and an image whose width is reduced to half can be obtained. In the known structure, the speed at which the signal charge is read out is increased by eliminating alternate rows of pixels in order to achieve a finder function in which monitor images are displayed at a high frame rate or to perform automatic focusing and automatic exposure with high performance. However, since the pixels can only be eliminated in units of rows, the aspect ratio of the obtained image is different from that of the original image. In comparison, if the alternate columns of pixels are eliminated using the overflow drain electrode 48 as above in addition to eliminating the alternate rows of pixels, the aspect ratio of the original image can be maintained. In addition, since the number of pixels is reduced to one-fourth, the frame rate can be further increased.

If one overflow drain electrode is provided for each of the optical sensors 4, the structure may also be such that, for example, the signal charge generated by the optical sensors 4 in the peripheral region is eliminated and only the signal charge generated by the optical sensors 4 in a central, rectangular region is read out. When electronic zooming is performed, only the signal charge generated by the optical sensors 4 positioned in a certain region is used. Accordingly, when the above function is used in electronic zooming, the signal charge which is generated by the optical sensors 4 positioned in a certain region (for example, the optical sensors 4 in a central, rectangular region) can be selectively read out. Therefore, the image can be obtained in a short time. In addition, in the case in which moving images are displayed, they can be displayed at a high frame rate.

In addition, the dynamic range can be increased by using the overflow drain electrodes 48 as an electronic shutter and setting the charge-storage time of the optical sensors 4 corresponding to the adjacent pixels to different values. More specifically, the storage time is set to a long time (which means that a positive voltage is applied to the corresponding overflow drain electrode 48 at an early time) for one of the two adjacent pixels, and is set to a short time (which means that a positive voltage is applied to the corresponding overflow drain electrodes 48 at a late time) for the other pixel. In such a case, if a large amount of light enters, charge saturation occurs at pixels with a long storage time but does not occur at pixels with a short storage time, and the light can be detected at the pixels with a short storage time. Therefore, when the amount of light is large, the image signal may be generated using detection results obtained at the pixels with a short storage time. On the contrary, when the amount of light is extremely small, the detection results obtained by the pixels with a long storage time may be used so that the image can be captured with sufficient sensitivity even if the light is weak.

In addition, the dynamic range can also be increased by the following method. That is, first, an image is captured while a certain storage time is set for all of the optical sensors. Then, map data showing the amount of incident light at each pixel is created. Then, regions where charge saturation has occurred are determined on the basis of the map data. The storage time for the optical sensors 4 positioned in regions where charge saturation has not occurred is unchanged, and the storage time for the optical sensors 4 positioned in regions where charge saturation has occurred is reduced. Accordingly, when the image is captured again, charge saturation does not occur in any region and a high-quality image can be obtained.

In addition, also in the solid-state imaging device 44, multiple reflection of light occurs between the antireflection film 32 and the overflow drain electrodes 48 and the total distance which light travels in the optical sensors 4 increases. Accordingly, the light detection sensitivity is higher than that of the known structure.

Next, an embodiment of a method for manufacturing a solid-state imaging device according to the present invention will be described below.

Figure 5A:
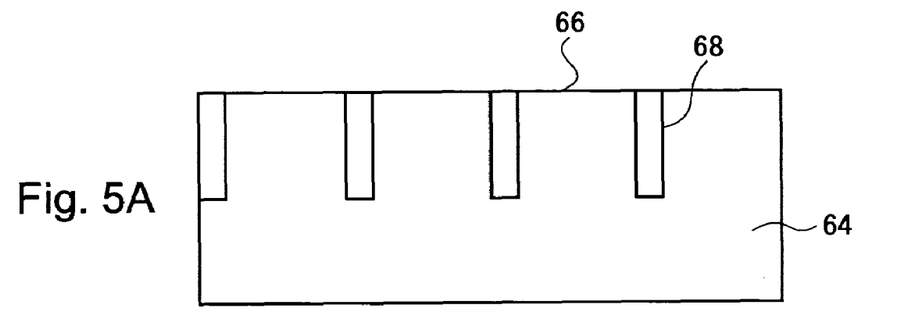
FIGS. 5A, 5B, and 5C are process diagrams of an example of a method for manufacturing a solid-state imaging device according to the present invention.
Figure 5B:
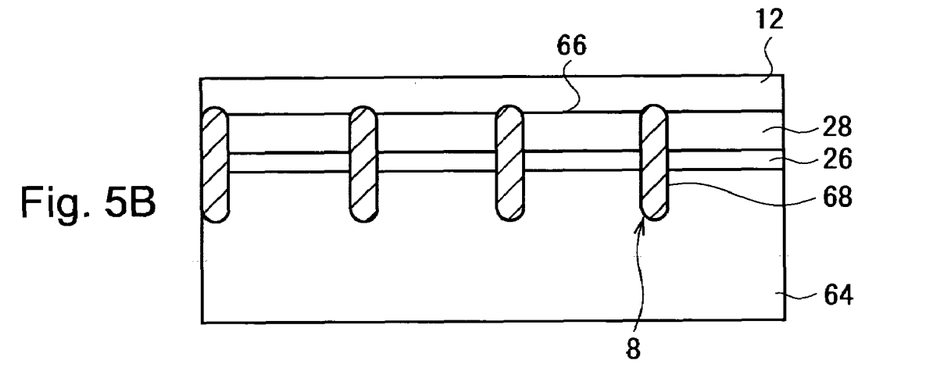
Figure 5C:
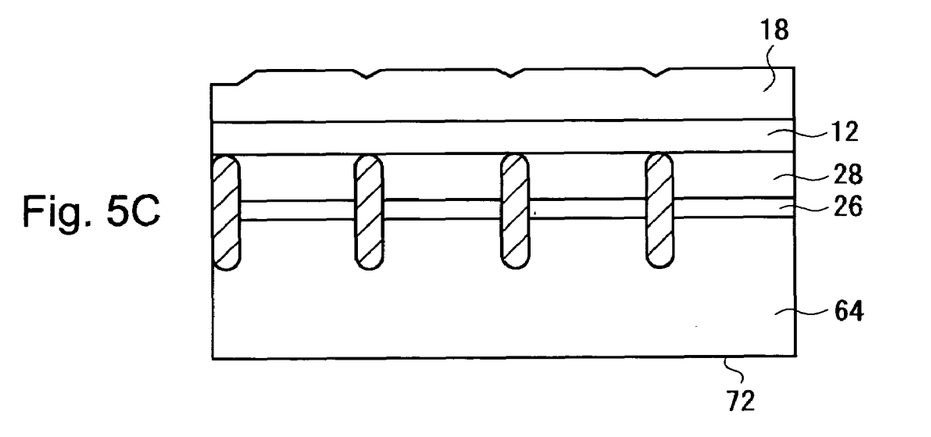
Figure 6A:
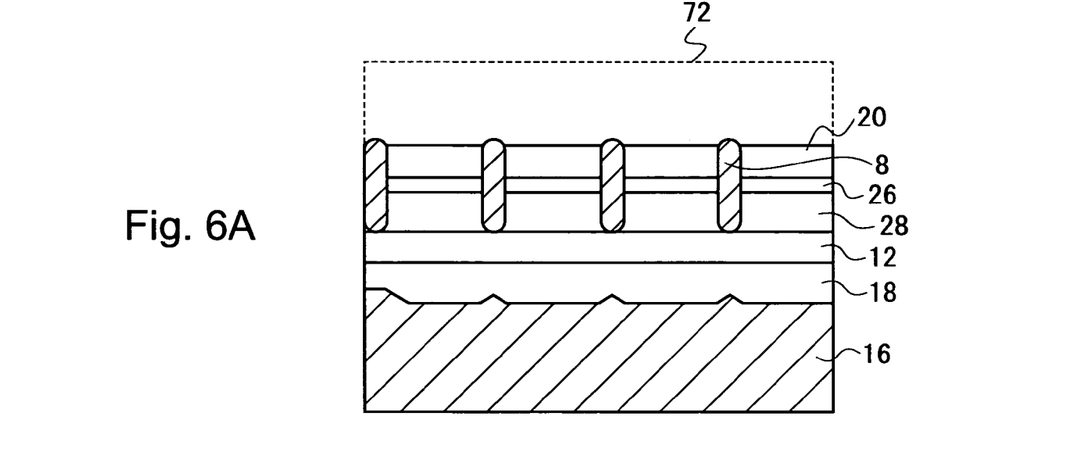
FIGS. 6A, 6B, and 6C are process diagrams showing processes performed after the process shown in FIG. 5C.
Figure 6B:
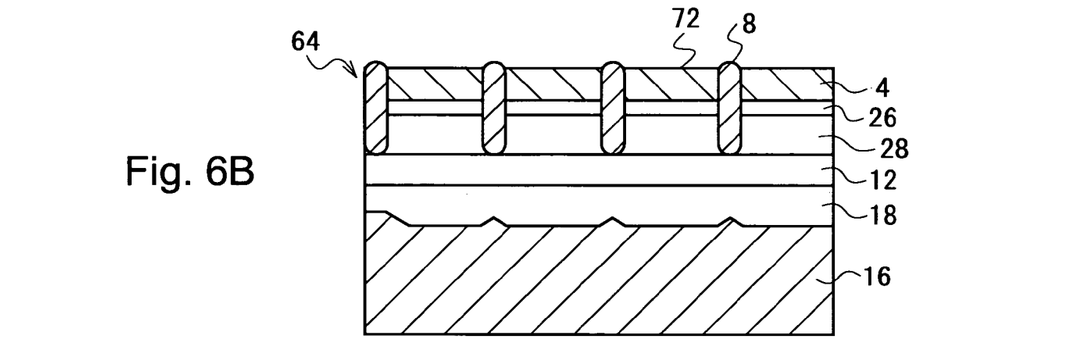
Figure 6C:
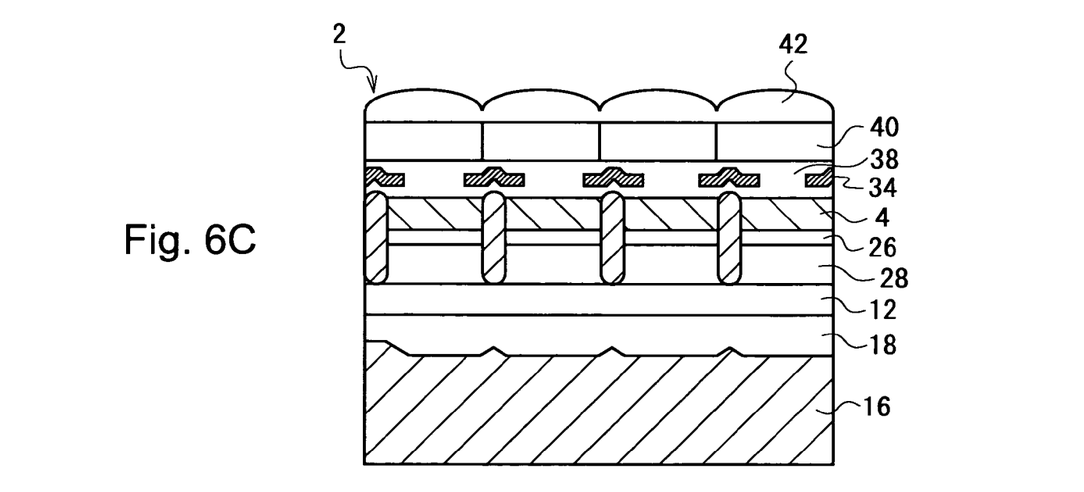

FIGS. 5A, 5B, and 5C are process diagrams of an example of a method for manufacturing a solid-state imaging device according to the present invention, and FIGS. 6A, 6B, and 6C are process diagrams showing processes performed after the process shown in FIG. 5C. Each of the figures shows a sectional side view of a part of a substrate structure in the corresponding process among the processes for manufacturing the solid-state imaging device. In the figures, components similar to those shown in FIGS. 1 and 2 are denoted by the same reference numerals.

In the present embodiment, a method for manufacturing the above-described solid-state imaging device 2 will be described as an example. First, as shown in FIG. 5A, trenches 68 for separating optical sensors from one another are formed at constant intervals in a first surface 66 of a silicon substrate 64 composed of single-crystal silicon.

Next, as shown in FIG. 5B, device-separating regions 8 are formed by filling the trenches 68 with a device-separating material. The material for filling the trenches 68 may be silicon oxide or silicon nitride so that it functions as a stopper in a chemical mechanical polishing (CMP) process, which is performed afterwards, and blocks light. Then, channel-stop regions (not shown) are formed by selectively implanting p-type impurity ions at high concentration such that the channel-stop regions extend perpendicular to the trenches 68 with gaps provided therebetween in the direction perpendicular to the page. Then, p– regions 26 having low-concentration p-type impurities are formed by implanting ions through the first surface 66 of the silicon substrate 64 at low energy.

Next, an insulating film (not shown in FIGS. 5A to 5C and FIGS. 6A to 6C), which corresponds to the insulating film 30 shown in FIG. 1, is formed on the first surface 66 of the silicon substrate 64, and first and second transfer electrodes 12 and 14 (only the first transfer electrode 12 is shown in FIG. 5B) are formed for each row of the optical sensors such that they extend along the rows of the optical sensors 4.

Then, as shown in FIG. 5C, a buffer layer 18 is formed by depositing, for example, silicon dioxide onto the first and the second transfer electrodes 12 and 14.

Then, as shown in FIG. 6A, a support substrate 16 composed of, for example, silicon, is bonded on the buffer layer 18. Then, the entire body is placed such that a second surface 72 of the silicon substrate 64 faces upward, and the silicon substrate 64 is polished by the CMP process until bottom end portions (top end portions in FIG. 6A) of the device-separating regions 8 appear in the second surface 72. Accordingly, the thickness of the silicon substrate 64 is reduced and a thin silicon layer 20 is obtained. In this process, the bottom end portions of the device-separating regions 8 are used as CMP stoppers.

Next, as shown in FIG. 6B, the optical sensors 4 are formed in the silicon substrate 64 by implanting impurity ions through the second surface 72 of the polished silicon substrate 64.

Next, an antireflection film (not shown in FIGS. 6A to 6C) is formed on the surfaces of the optical sensors 4. Then, as shown in FIG. 6C, a light-shielding film 34 having apertures at positions corresponding to the optical sensors 4 is formed on the second surface 72 of the silicon substrate 64 with an insulating layer provided therebetween. Then, a planarizing film 38 composed of an insulating material, a color filter 40, and an on-chip lens 42 are successively formed. According to the above-described processes, the solid-state imaging device 2 which has electrodes behind the optical sensors 4 and which provides the above-described effects is manufactured.

In the method for manufacturing the solid-state imaging device 2 according to the present embodiment, the p-regions 26, which function as an overflow barrier, are formed by implanting ions into the silicon substrate 64 through the first surface 66 thereof at low energy before the electrodes are formed on the first surface 66 of the silicon substrate 64, the overflow barrier being positioned under the optical sensors 4 when the solid-state imaging device 2 is completed. Accordingly, it is not necessary to implant the ions deep into the silicon substrate at high energy from the front of the solid-state imaging device 2 to form the overflow barrier as in the known structure. Therefore, the profile of the implanted impurities can be reliably controlled and the thickness of the overflow barrier can be reduced.

As a result, a distance which light reflected by the first and the second transfer electrodes 12 and 14 toward the optical sensors 4 travels in the overflow barrier, which does not contribute to photoelectric conversion, can be reduced compared to the distance which the reflected light travels in the optical sensors 4. Therefore, the reflected light is effectively converted into electric charge by the optical sensors 4, and the optical detection sensitivity increases. Accordingly, the size of the optical sensors 4 can be reduced and the number of pixels in the solid-state imaging device 2 can be increased accordingly.

In addition, in the method for manufacturing the solid-state imaging device 2 according to the present embodiment, the overflow barrier is formed by implanting ions into a surface region, and it is not necessary to perform ion implantation at high energy. Since the ion implantation can be performed at low energy, the solid-state imaging device 2 can be easily manufactured.

In addition, in the manufacturing method according to the present embodiment, the bottom end portions of the device-separating regions 8 are used as CMP stoppers when the silicon substrate 64 is polished to reduce the thickness thereof. Therefore, the thickness of the polished silicon substrate 64 (the thin silicon layer 20) can be accurately controlled.

The solid-state imaging device 44 according to the above-described second embodiment may also be manufactured by a method similar to the above-described method for manufacturing the solid-state imaging device with regard to the structure in which the electrodes are provided behind the optical sensors. In this case, one electrode may be provided for each column of the optical sensors 4, or for each of the optical sensors 4.

INDUSTRIAL APPLICABILITY

In the solid-state imaging device according to the present invention and the solid-state imaging device manufactured by the method according to the present invention, the electrodes are disposed between the buffer layer and the optical sensors, that is, behind the optical sensors. Accordingly, when, for example, the electrodes are used as charge transfer electrodes, it is not necessary to arrange the charge transfer electrodes on the light-receiving surfaces of the optical sensors. In addition, when the electrodes are used as overflow drain electrodes, unnecessary charge stored in the optical sensors can be removed by applying a voltage to the electrodes.

The invention claimed is:

1. A solid-state imaging device having a plurality of optical sensors which are adjacent to one another, comprising:
   a buffer layer comprising an insulating material;
   a single-crystal silicon thin film provided over the buffer layer;
   the plurality of optical sensors provided in the single-crystal silicon thin film and arranged in a matrix pattern such that the optical sensors are adjacent to one another; and
   electrodes which are disposed between at least portions of the buffer layer and the single crystal having the optical sensors and which control transfer of signals generated by the optical sensors, the signals being generated when the optical sensors receive light; a barrier overflow region located directly beneath each optical sensor and extending at least substantially across a region of the entire corresponding optical sensor; and a transfer path region located directly beneath the barrier overflow region.

2. A solid-state imaging device according to claim 1, further comprising an insulating film interposed between the electrodes and the optical sensors.

3. A solid-state imaging device according to claim 2, wherein the insulating film reflects light incident from the optical sensors up toward the optical sensors.

4. A solid-state imaging device according to claim 1, wherein the electrodes reflect light incident from the optical sensors up toward the optical sensors.

5. A solid-state imaging device according to claim 3, further comprising an antireflection film which is provided above the optical sensors and which prevents reflection of light incident on the optical sensors.

6. A solid-state imaging device according to claim 1, wherein each of the optical sensors has more than one of the electrodes, and the signal charge generated by the optical sensors on each column is transferred by the corresponding electrodes along the column of the optical sensors.

7. A solid-state imaging device according to claim 1, wherein the signal charge generated by the optical sensors is removed by the electrodes.

8. A solid-state imaging device according to claim 1, wherein the overflow barrier is disposed under the optical sensors but above the transfer path, and is formed in the single-crystal silicon thin film material within which the optical sensors are formed.

9. A solid-state imaging device according to claim 1, wherein the overflow barrier is formed by impurities implanted into the single-crystal silicon thin film, the overflow barrier being positioned under the optical sensors.

10. A solid-state imaging device according to claim 1, wherein the overflow barrier disposed under the optical sensors is formed in the single-crystal silicon thin film material within which the optical sensors are formed, the transfer path region also being formed in the single-crystal silicon thin film material, and wherein both the overflow barrier and the transfer path regions are at least substantially coextensive with boundaries of a corresponding optical sensor.

11. A solid-state imaging device having a plurality of optical sensors which are adjacent to one another, comprising:
   a single-crystal silicon thin film;
   the plurality of optical sensors provided in the single-crystal silicon thin film and arranged in a matrix pattern such that the optical sensors are adjacent to one another; and
   a barrier overflow region located between each optical sensor and a transfer path region beneath the barrier overflow region located in single-crystal silicon thin film and wherein both the overflow barrier and the transfer path regions are at least substantially coextensive with boundaries of a corresponding optical sensor.

12. A solid-state imaging device having a plurality of optical sensors which are adjacent to one another, comprising:
   a buffer layer comprising an insulating material;
   a single-crystal silicon thin film provided over the buffer layer;
   the plurality of optical sensors provided in the single-crystal silicon thin film and arranged in a matrix pattern such that the optical sensors are adjacent to one another; and
   electrodes which are disposed between at least portions of the buffer layer and the optical sensors and which control signal charge generated by the optical sensors, the signal charge being generated when the optical sensors receive light, and wherein all portions of a transfer path region are separated from the optical sensor by the overflow barrier region.

* * * * *